United States Patent
Udupa et al.

(10) Patent No.: US 7,786,909 B2
(45) Date of Patent: Aug. 31, 2010

(54) ANALOG TO DIGITAL CONVERTER WITH IMPROVED INPUT OVERLOAD RECOVERY

(75) Inventors: Anand Hariraj Udupa, Richardson, TX (US); Neeraj Shrivastava, Bangalore (IN); Nitin Agarwal, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 7 days.

(21) Appl. No.: 12/337,658

(22) Filed: Dec. 18, 2008

(65) Prior Publication Data

US 2009/0184853 A1    Jul. 23, 2009

Related U.S. Application Data

(60) Provisional application No. 61/022,365, filed on Jan. 21, 2008.

(51) Int. Cl.
*H03M 1/06* (2006.01)
(52) U.S. Cl. .................. 341/118; 341/155; 341/172
(58) Field of Classification Search .............. 341/118, 341/172, 155
See application file for complete search history.

(56) References Cited

U.S. PATENT DOCUMENTS

| | | | | |
|---|---|---|---|---|
| 3,737,891 A | * | 6/1973 | Metcalf | 341/118 |
| 5,416,485 A | * | 5/1995 | Lee | 341/172 |
| 2007/0290914 A1 | * | 12/2007 | Matsushita et al. | 341/155 |

* cited by examiner

*Primary Examiner*—Jean B Jeanglaude
(74) *Attorney, Agent, or Firm*—John J. Patti; Wade J. Brady, III; Frederick J. Telecky, Jr.

(57) ABSTRACT

With high speed analog to digital converters (ADCs), components within the ADC can enter a saturation region when an input exceeded the input range of the ADC, which can cause errors. Here, a sample of an input signal to an ADC is compared with the upper and lower full-scale levels of the ADC. If input overload is detected, inputs to amplifiers in an input stage of the ADC are forced to zero for the duration of the input overload, and are thus prevented from going into saturation. Input overload conditions are signaled directly to an output digital block of the ADC, which provides output digital codes equivalent to either the upper or the lower full scale level depending on whether the input overload is signaled as exceeding the upper level or the lower level. Input overload recovery time of the ADC may thus be minimized.

9 Claims, 5 Drawing Sheets

ANALOG TO DIGITAL CONVERTER WITH IMPROVED INPUT OVERLOAD RECOVERY

RELATED APPLICATION

The present application claims priority from co-pending U.S. provisional application Ser. No. 61/022,365, entitled: "Analog To Digital Converter With Improved Input Overload Recovery", filed on: 21 Jan. 2008, naming Texas Instruments Inc (the intended assignee) as Applicant and the same inventors as in the subject application as inventors, and is incorporated in its entirety herewith.

BACKGROUND

1. Field of the Technical Disclosure

The present disclosure relates generally to analog to digital converters (ADC), and more specifically to an ADC with improved input overload recovery.

2. Related Art

Analog to Digital Converters (ADCs) are used to generate a sequence of digital codes representing the strength of an input signal at corresponding time instances. ADCs may be implemented using any of several approaches such as successive approximation register (SAR) ADC, pipeline ADC etc well known in the relevant arts.

An ADC may be designed to receive input signals with strengths (e.g., voltage and/or current magnitudes, etc.) lying within a range, termed full-scale range of the ADC. For example, assuming a full-scale range of 0 to 1 Volts, the minimum possible output value of 0 may correspond to an input of 0 volts and maximum possible output value of $((2^{16})-1)$ may correspond to the maximum voltage of 1 volts.

ADCs often encounter input overload conditions. An input overload condition corresponds to a situation in which the input signal strength has a strength beyond/outside the full-scale range. In the illustrative example of above, an input overload condition exists if the input sample has a voltage exceeding 1 volts or below 0 volts.

One problem with input overload condition is that it may cause internal components, such as amplifiers, contained in an ADC to be driven to operation in a saturation region. As a consequence, the outputs (of internal circuits such as amplifiers) in the ADC may not accurately represent the input signal for a period of time (generally termed recovery time) even after the input signal strength returns to being within the full-scale range.

Therefore, when the input signal changes from an overloaded signal to a signal that is within the normal full scale range, the ADC may not be able to recover fast enough, and the digital codes generated by the ADC may not be accurate at least for a duration equal to the recovery time (generally, the first few clock cycles after the overload signal has ended).

Several aspects of the present invention provide an ADC which addresses one or more of the problems noted above.

SUMMARY

An aspect of the present invention avoids an amplifier of an analog to digital converter (ADC) from entering a saturation region even when the input signal exhibits an input overload condition. In an embodiment, a sample of an input signal to an ADC is compared with the upper and lower full-scale levels of the ADC. If input overload is detected, inputs to amplifiers in an input stage of the ADC are forced to zero for the duration of the input overload, and are thus prevented from going into saturation.

According to another aspect of the present invention, input overload conditions are signaled directly to an output digital block of the ADC. In response to such signaling, the output digital block provides output digital codes equivalent to either the upper or the lower full scale level depending on whether the input overload is signaled as exceeding the upper level or the lower level.

Several aspects of the invention are described below with reference to examples for illustration. It should be understood that numerous specific details, relationships, and methods are set forth to provide a full understanding of the invention. One skilled in the relevant art, however, will readily recognize that the invention can be practiced without one or more of the specific details, or with other methods, etc. In other instances, well known structures or operations are not shown in detail to avoid obscuring the features of the invention.

BRIEF DESCRIPTION OF THE DRAWINGS

The present invention will be described with reference to the following accompanying drawings, which are described briefly below.

In the drawings, like reference numbers generally indicate identical, functionally similar, and/or structurally similar elements. The drawing in which an element first appears is indicated by the leftmost digit(s) in the corresponding reference number.

DETAILED DESCRIPTION

1. Example Environment

Figure 1A:
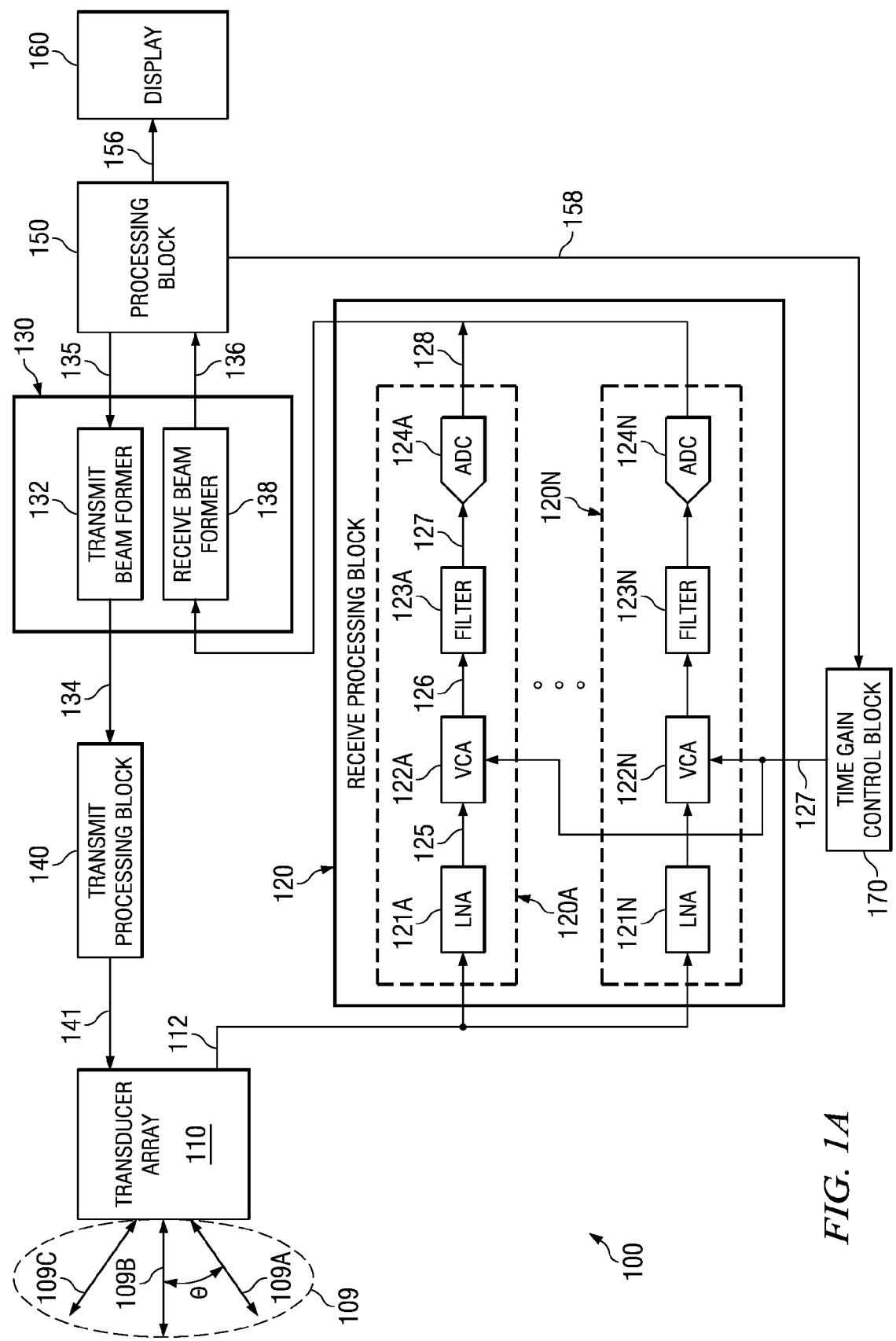
FIG. 1A is a block diagram illustrating an ultrasound system in which several aspects of the present invention can be implemented.

FIG. 1A is a block diagram illustrating an example system in which several aspects of the present invention can be implemented. The diagram is shown containing the block-level details of an example ultrasound system 100. Only those blocks and/or components of the system as required for an understanding of the present invention are illustrated and described. A typical ultrasound system may have various other components/blocks to provide corresponding features. Ultrasound system 100 is shown containing transducer array 110, receive processing block 120, beam forming block 130, transmit processing block 140, processing block 150, display 160 and time gain control block 170.

Transducer array 110 contains an array of transducers (labeled A through N for easy reference, but not shown in FIG. 1A) to convert electrical signals to sound of ultrasonic frequency, and vice versa. Transducer array 110 may contain multiple transducers arranged spatially in a desired pattern (for example, in a linear fashion, with transducers arranged side by side in a straight line). By controlling the characteristics (such as phase and amplitude) of the electrical signals provided as inputs (via path 141) to each of the transducers, transducer array 110 may be caused to transmit a pulse (109) in a desired direction or angle (θ).

As an illustration, arrows 109A, 109B and 109C are shown in FIG. 1A as three possible beam directions. After transmitting a pulse, the transducers in transducer array 10 immediately switch to receive mode. In receive mode, the transducers receive reflected pulses from various surfaces. The reflected pulses may be received along any direction. Transducers in transducer array 110 convert the received ultrasound pulses to corresponding electrical signals, and forward the electrical pulses on path 112 to receive processing block 120. The number/label 109 is used below to refer to both transmitted as well as received ultrasound pulses.

Beam forming unit 130 is shown containing transmit beam former 132 and receive beam former 138. Transmit beam former 132 may receive a command from processing block 150 via path 135, forms a transmit beam (which may be in the form of a directional pulse when transmitted from path 109 as noted above), and forwards the data representing the pulse (or beam) to be transmitted to transmit processing block 140 via path 134. Alternatively, beam forming unit 130 may contain a control unit (not shown) that controls the operation of transmit beam former 132 (as well as receive beam former 138, described below). The transmit beam may be formed using electronic beam forming techniques, such as using phased arrays, etc., well known in the relevant arts.

Transmit processing block 140 receives the data sent by transmit beam former 132 via path 134, and performs several operations on the data, such as digital to analog conversion, filtering, amplification, etc. Transmit processing block 140 provides the processed analog signal(s) to transducers in transducer array 110.

Receive processing block 120 receives from transducer array 110 (via path 112) electrical signals (e.g., pulses/echoes of the transmitted pulse) representing reflected sound pulses. Receive processing block 120 performs various operations on the received pulses such as amplification, filtering and analog to digital conversion, and provides the processed information to receive beam former 138 via path 123. Receive processing block 120 is shown containing multiple processing chains (120A through 120N), with each chain processing a signal received from a corresponding one of the (A through N) transducers in transducer array 110.

Chain 120A is shown containing low noise amplifier (LNA) 121A, voltage controlled amplifier (VCA) 122A, anti-aliasing filter (filter 123A), and analog to digital converter (ADC 124A). Chain 120N is similarly shown containing low noise amplifier (LNA) 121N, voltage controlled amplifier (VCA) 122N, anti-aliasing filter (filter 123N), and analog to digital converter (ADC 124N).

Receive beam former 138 receives the outputs of each of chains 120A through 120N, and operates to determine the direction (109) along which each reflected pulse is received, and forwards the corresponding information to processing block 150, on path 136. Although not shown, the data from each of the chains may be serialized and provided on path 136 using interfaces such as LVDS (low voltage differential signaling). As is well known, the operations performed in receive beam former 138 enable (in processor 150) the creation of images (which may be displayed by processing block 150 on display 160) representing the surfaces/objects off which the transmit pulses are reflected.

One of several well-known techniques may be employed in receive beam former 138 to perform the corresponding beam forming operations. Beam forming block 130, containing transmit and receive beam formers 132 and 138 respectively may be implemented using a "beam forming" ASIC (application specific integrated circuit). The operation of receive beam former 138 may be controlled by a control unit contained within beam forming unit 130, or may be controlled by processor 150, depending on the specific implementation.

Processing block 150 may signal transmit beam former 132 to generate transmit pulses (or beams). Processing block 150 receives reflected pulses provided by receive beam former 138, and operates to create representations of image(s) (image data) representing the objects or surfaces that reflected the transmitted pulse. Processing block 150 provides the image data to display 160 (via path 156), which displays the image. Processing block 150 may be implemented using various approaches. For example, processing block 150 may be implemented as a digital signal processor (DSP) to execute various algorithms to generate the image data. Some of the processing operations performed by processing block 150 include Doppler processing, 2D and 3D image generation, etc, as is well known in the relevant arts.

Time gain control block 170 operates to provide control signals (on path 127) to each of the VCAs (VCA 122A through VCA 122N) to adjust the gain of the corresponding VCA to cause the reflected pulse amplitudes to be all scaled to a same desired level. The operation of time gain control block in providing the time-gain control values to the VCAs may be coordinated by processing block 150 (via path 158), or by a control unit (not shown) within beam forming unit 130.

As noted above, receive processing block 120 may contain multiple processing chains, with the corresponding components in each chain performing respective operations. For example, with respect to chain 120A, LNA 121A provides amplification to a received electrical signal on path 112 (representing a reflected pulse) with minimum noise addition, and forwards the amplified signal to VCA 122A on path 125.

VCA 122A provides a variable gain to enable all received pulses (corresponding to a single transmitted pulse) to be amplified to a desired same amplitude level. Generally, the desired same level may be equal to the full-scale range of the ADC in the chain (ADC 124A with respect to chain 120A). The output (126) of VCA 122A is provided to anti-aliasing filter 123A, which removes frequency components above a desired frequency (at least greater than half the sampling frequency (Nyquist frequency) of ADC 124A).

ADC 124A samples the gained and anti-alias filtered signal received from anti-alias filter 123A at corresponding sampling time instances to generate corresponding digital codes. ADC 124A forwards the digital codes on path 128 to receive beam former 138. The LNAs, VCAs, filters and ADCs of chains 120B-120N perform similar operations.

With respect to ADCs in receive processing block 120, when the amplitude of the input signal received on path 112 is outside of a predetermined range, the corresponding input provided to the ADCs in chains 120A-120N (e.g., signal on input path 127 of ADC 124A) may exceed the full scale range of the ADCs, and may potentially result in erroneous digital codes on one or more of the corresponding ADC outputs (e.g., path 128 of ADC 124A). Further, ultrasound system 100 may use zero-crossing detection of reflected ultrasound waves to measure a mean frequency of the reflected waves, and thereby to compute a corresponding velocity vector (blood flow velocity, for instance). An input overload condition in one or more ADCs in receive processing block 120 may result in errors in determination of the time instances of the zero-crossings, and may thereby produce a wrong velocity estimate.

One prior approach that seeks to address the problem noted above involves designing the internal circuits (e.g., amplifiers) of the ADCs with wider input ranges to accommodate an increased input signal range (overload-range) resulting from an overload input. However, the input range cannot be extended without limit. Another prior approach employs signal clamping circuitry, for example, at the inputs and/or outputs of the corresponding amplifiers in the ADC. However, it may be difficult to design clamping circuitry with precise clamping voltages, and generally such an approach degrades or alters (due to non-precise clamping voltage thresholds), at least to some extent, the ADC input even when the input is within the range of the ADC.

An ADC implemented according to various aspects of the present invention overcomes such problems. The description is continued with respect to the details of an example ADC in which the features can be deployed.

2. ADC

Figure 1B:
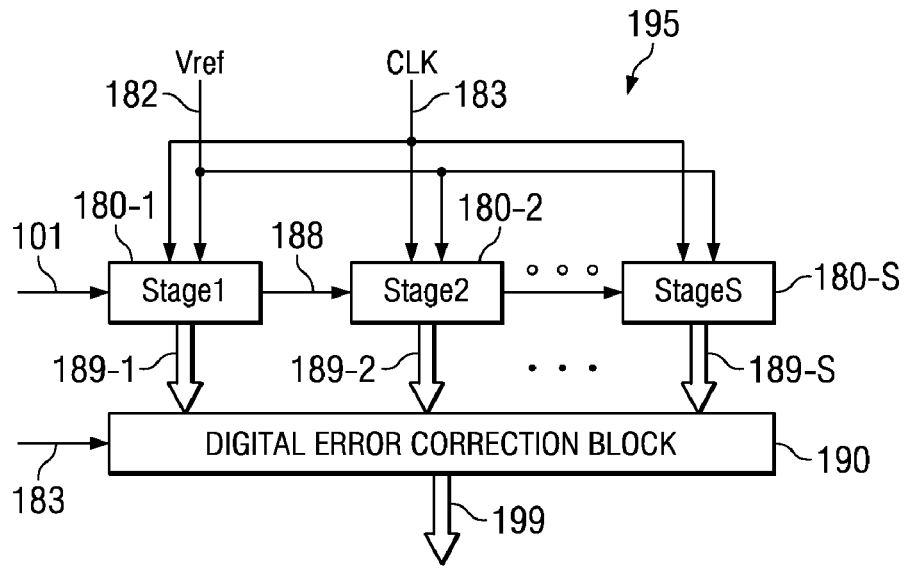
FIG. 1B is a block diagram illustrating the details of an example environment in which several aspects of the present invention can be implemented.

FIG. 1B is a block diagram of an example ADC in which several aspects of the present invention can be implemented. The description below is provided in the context of a pipeline ADC merely for illustration. However, several aspects of the present invention can be implemented in other types of ADCs as well. Further, although the description below assumes that (the stages of) the ADC is (are) implemented using switched capacitor techniques, other techniques can also be used. In such non switched-capacitor ADC implementations, a sample and hold amplifier may be used prior to stage 1 of the ADC. ADC 195 of FIG. 1, which may be used in place of ADCs 124A-124N of FIG. 1, is shown containing stages 180-1 through 180-S, and digital error correction block 130.

Digital error correction block 180 receives sub-codes from various stages 180-1 through 180-S (on paths 189-1 through 189-S respectively), and generates a digital code corresponding to the sample received on path 101 (which, for example, could correspond to path 127 of FIG. 1A). Various error correction approaches, well known in the relevant arts, may be used to correct any errors in the received sub-codes. The generated digital code is provided on path 199 (which corresponds to path 128 of FIG. 1A) as a final digital code corresponding to the voltage of a sample on the input analog signal at a particular time instant.

Figure 2:
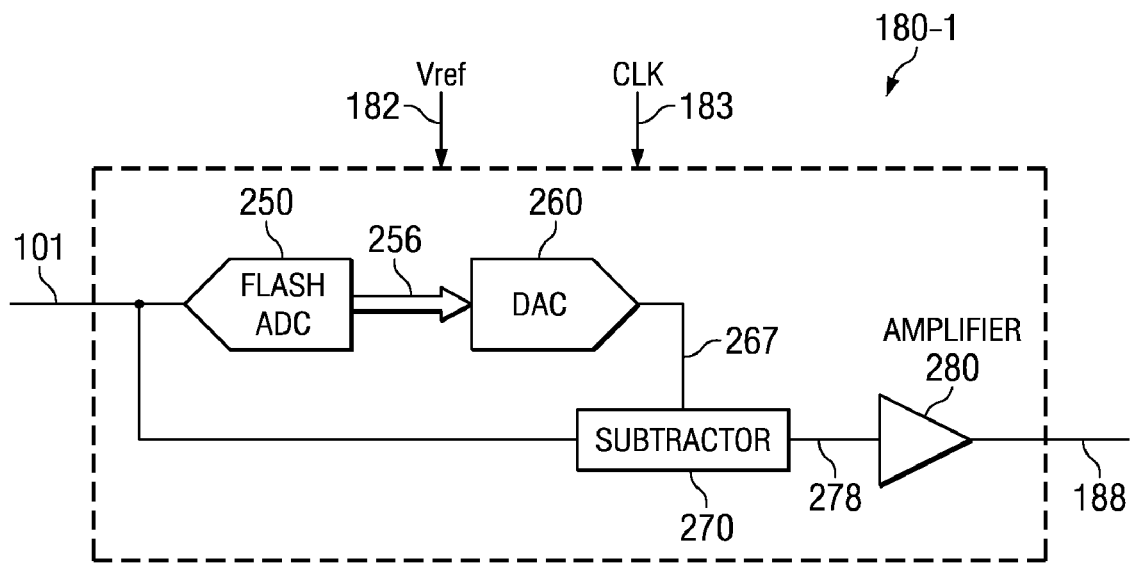
FIG. 2 illustrates the logical operation of a stage of a pipeline ADC.

Each stage 180-1 through 180-S generates a sub-code (based on the reference signal Vref received on path 182) corresponding to a voltage level of an analog signal received as an input, and an amplified residue signal as an input to a (any) next stage. For example, stage 180-1 converts a voltage level on path 101 to generate a sub-code on path 189-1, and the amplified residue signal generated on path 188 is provided as an input to stage 180-2. A common reference signal Vref is generally provided to stages 180-1 through 180-S. A common clock (CLK 183) is generally provided to stages 180-1 through 180-S. FIG. 2 further illustrates (logical) components contained in each stage (described with reference to stage 180-1 only, for conciseness) of a pipe line ADC according to a known approach.

3. Stage of an ADC

With respect to FIG. 2, stage 180-1 is shown containing flash ADC 250, digital to analog converter (DAC) 260, subtractor 270 and amplifier 280. Flash ADC 250 (an example of a sub ADC) converts a sample of an analog signal received on path 101 into a corresponding p-bit sub-code provided on path 256 (contained in path 189-1 of FIG. 1B, 'p' being smaller than N). DAC 260 generates the voltage equivalent of the sub-code received on path 256. The generated voltage (Vdac) is provided on path 267.

Subtractor 270 generates on path 278 a residue signal as the difference of sample 101 (Vi) and the analog signal received on path 267. Amplifier 280 amplifies the residue signal (Vi-Vdac) and the amplified signal is provided on path 188 as an amplified residue signal. The signal on path 188 is used to resolve the remaining bits in the N-bit digital code by the subsequent stages of the ADC. The manner in which the residue signal is generated by each stage is described below with respect to FIGS. 3A and 3B.

Figure 3A:
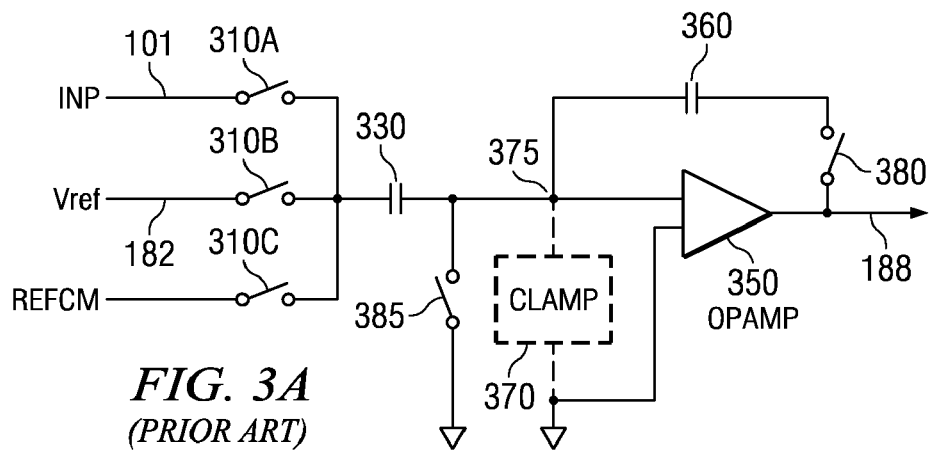
FIG. 3A is a circuit diagram illustrating the manner in which a DAC, subtractor and amplifier portions of a stage are implemented in an embodiment.
Figure 3B:
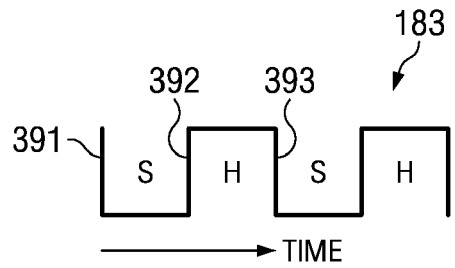
FIG. 3B is a timing diagram illustrating sample and hold phases in a pipeline ADC.

FIG. 3A is a circuit diagram illustrating the manner in which DAC 260, subtractor 270, and gain amplifier 280 are implemented in an embodiment providing p-bit sub-codes, and FIG. 3B is a timing diagram used to illustrate the sample and hold phases of the circuit. The circuit diagram is shown containing switches 310A-310C, switch 385, sampling capacitor 330, operational amplifier (OPAMP) 350, feedback capacitor 360, feedback switch 380, and clamping circuit (clamp) 370. It should be appreciated that only a single unit sampling capacitor (330) and corresponding switches are shown in FIG. 3A for conciseness. However the circuit would contain 2^p such sets, wherein '^' represents the 'power of' mathematical operation.

The circuit of FIG. 3A operates using two phases, with respect to CLK 183, shown as sampling phase S and hold phase H, in FIG. 3B. In the first phase (sampling phase S) between time points 391 and 392, switch 310A and switch 385 are closed at time points 391 and the remaining switches 380, 310B, and 310C are kept open. As a result, sampling (input) capacitor 330 is ideally charged (in interval 391-392) to the voltage of input sample received on path (INP) 101.

In the second phase (hold phase H between time points 392-393), feedback switch 380 is closed and switches 310A and 385 are kept open. Connections of switches 310B and 310C are made such that the input terminals of sampling capacitor 330 is connected either to Vref or to REFCM terminal, as determined from the output of flash ADC 250 (sub-code P). As a result, capacitor 330 transfers a charge proportional to the difference (residue) of input signal and the Vref or REFCM to feedback capacitor 360 (up to time point 393). The residue is amplified by OPAMP 350 and provided as amplified residue signal to the next stage (on path 188), as desired. The sample and hold phases may be repeated.

As noted above, if input 101 has a strength beyond the full-scale range of ADC 195, components such as OPAMP 350 (and amplifiers in other stages) may go into saturation. An overload condition is illustrated next with respect to a diagram.

4. Input Overload

Figure 4:
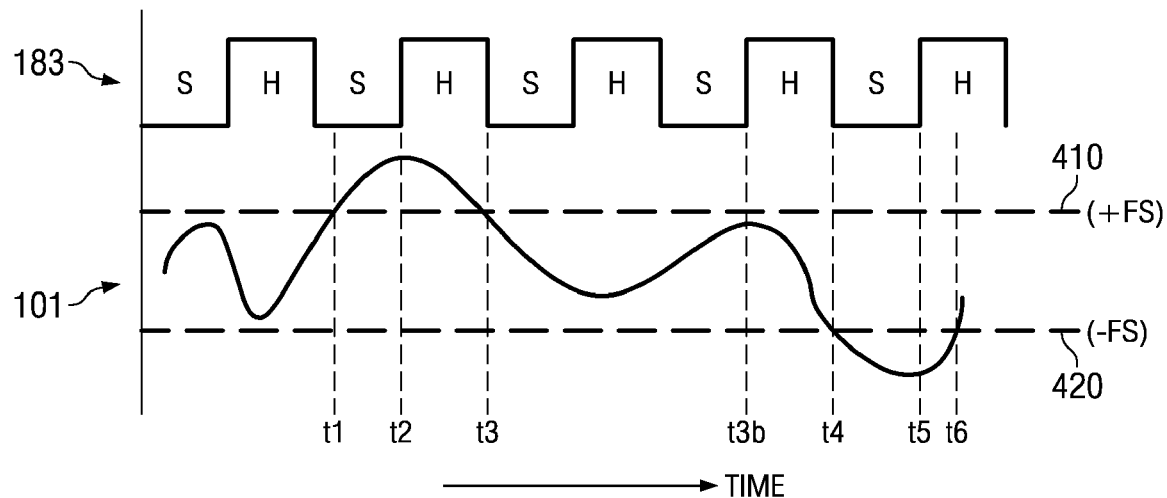
FIG. 4 is a diagram illustrating an input overload condition in an ADC.

FIG. 4 is a diagram illustrating an example input overload scenario. A varying input signal 101 is shown with respect to several sample and hold phases of clock 183. Voltage levels

410 and 420 respectively represent the maximum (upper limit) and minimum values (lower limit) of ADC 195's full scale range.

In the Figure, input signal 101 is shown as being greater (more positive) than level 410 (higher or upper limit of ADC 195's full scale full scale, denoted as +FS in the Figure) during time interval (t1 to t3), and less (more negative, assuming ADC 195 is designed to handle positive and negative values of input) than level 420 (lower limit of ADC 195's full scale full scale, denoted as –FS in the Figure) during time interval (t4 to t6). Thus, ADC 195 has input overload conditions during time intervals t1-t3 as well as t4-t6. As a result, components such as OPAMP 350 may go into saturation during the hold phases that start at t2 and t4.

At time instance t3, input signal 101 falls within the full scale range. However, as noted above, it may take one or more cycles for amplifiers in the ADC to recover from the saturation conditions, and to start operating in the linear region. As an example, assuming OPAMP 350 was in saturation at end of t3, it may take two cycles (i.e., till time instance t3b) for OPAMP 350 to start operating into the linear region of operation.

As a result, output 188, at least for the duration of the two cycles noted above, may be erroneous, thereby causing stages 180-2 through 180-S to generate correspondingly wrong digital codes. Consequently, digital codes provided as output on path 199 maybe in error. Assuming that other amplifiers in ADC 195 go into saturation, wrong digital codes may similarly be generated in stages subsequent to such other amplifiers.

In the prior embodiment described above, clamp 370 operates to clamp (restrict) the input to OPAMP 350 to within a corresponding range (e.g., linear range of operation of OPAMP 350) to prevent OPAMP 350 from going into saturation. However, as noted above, it may be difficult to design clamp 370 with precise clamping voltages. As an illustration, assuming the higher clamping voltage (410 of FIG. 4) is 1 volt (V), it may be practically difficult to design clamp 370 to clamp node 375 (to 1V) when voltage at node 375 is 1V or above, and perform no clamping action at all when voltage at node 375 falls below 1V by whatever small voltage. As a result, the above approach degrades or clamps (due to non-precise clamping voltage thresholds), at least to some extent, the ADC input even when the input is within the range of the ADC, and may not be desirable.

Alternatively, OPAMP 350 may be designed to inherently accommodate input overload conditions (wider range) without going into saturation. However, such an approach cannot be extended without limit. Further such an approach may require modification of various design parameters of OPAMP 350, and may render the ADC more expensive and/or complex. For example, instead of designing OPAMP 350 using a single stage, a wider input range requirement may dictate the use of a two-stage architecture, which may result in higher power and more noise.

Several aspects of the present invention therefore prevent input signals beyond the full-scale range of an ADC from being provided to the ADC. Input overload conditions are detected at the input of the ADC itself, and therefore not allowed to propagate further along the data path in the ADC. Input overload recovery time of the ADC are thus minimized or reduced to zero. Several aspects of the present invention are illustrated next in detail with respect to examples.

5. Preventing Input Overload to Improve Overload Recovery

Figure 5:
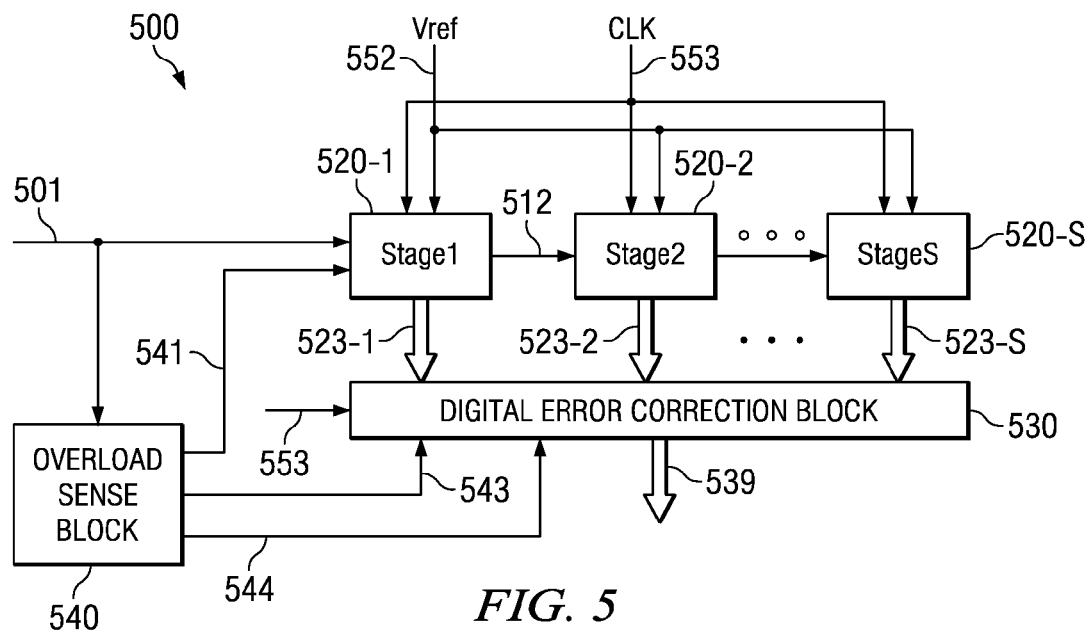
FIG. 5 is a block diagram of an ADC in an embodiment of the present invention.

FIG. 5 is a block diagram of an ADC in an embodiment of the present invention. ADC 500 is shown containing stages 520-1 through 520-S, digital error correction block 530, and overload sense block 540. Stages 520-1 through 520-S, and digital error correction block 530 operate similar to stages 180-1 through 180-S, and Digital error correction block 190 of FIG. 1B, and their operation is not repeated here in the interest of conciseness.

Further, although not shown, when ADC 500 is implemented using non switched-capacitor techniques, a sample and hold amplifier may be used prior to stage 1 (520-1) of the ADC. Stages 520-1 through 520-S may together be conveniently viewed as a 'converter block', while digital error correction block 530 may be viewed as an 'output block'.

Overload sense block 540 receives input signal 501, and determines if input signal 501 exceeds the full-scale range of ADC 500. If input 501 is greater than the maximum value of the full-scale range (positive overload), or less than the minimum value of the full-scale range (negative overload), overload sense block 540 generates a 'freeze' signal on path 541, to prevent the amplifier in stage 520-1 from operating in the saturation region during corresponding hold phases of the amplifier, as described with respect to an example implementation below.

In alternative embodiments in which a sample and hold (S/H) amplifier is used prior to stage 1 in the data path (with input 501 being provided as input to the S/H amplifier instead), the freeze signal may instead be provided to such S/H amplifier. Also, when ADC 500 is implemented using non-pipelined ADC approaches, an input S/H amplifier may be used.

In general, the freeze signal is provided to the earliest stage of an ADC, which may be viewed as an "input stage". Typically, the input stage resolves the most significant bits (MSBs). As may be appreciated, stage 520-1 resolves MSBs. In case of a successive appropriate register (SAR) type ADC, freeze signal is provided when the input signal is being processed in a first iteration (to resolve the MSBs).

If input 501 is greater than the maximum value of the full-scale range (positive overload), or less than the minimum value of the full-scale range (negative overload), overload sense block 540 generates a disable (freeze) signal on path 541, disabling the amplifier in stage 520-1 during corresponding hold phases of the amplifier, as described with respect to an example implementation below.

As a result, the overload values of input signal 501 are prevented from being applied to amplifier(s) in stage 520-1, the output on path 188 is a zero volts signal, and overload voltages are prevented from propagating to subsequent portions (stages 520-2 through 520-S) as well.

If input 501 is greater than the maximum value (upper limit) of the full-scale range (corresponding to a positive overload condition), overload sense block 540 provides a bit (for example, at logic 1) to digital error correction block 530 on path 543 during a corresponding hold phase, indicating a positive overload condition. In response, digital error correction block provides as output (during the time duration for which input signal is indicated to be a positive overload), a digital code representing the upper limit of the full-scale range of ADC 500. The upper limit may correspond, depending on the specific implementation for example, to a digital code output with all bits in the code as logic 1.

Similarly, if input 501 is less than the minimum value (lower limit) of the full-scale range (corresponding to a negative overload condition), overload sense block 540 provides a bit (for example, at logic 1) to digital error correction block 530 on path 544 during a corresponding hold phase, indicating a negative overload condition. In response, digital error correction block provides as output (during the time duration for which input signal is indicated to be a negative overload), a digital code representing the lower limit of the full-scale range of ADC 500. The lower limit may correspond, for example, to a digital code output with all bits in the code as logic 0.

Figure 6A:
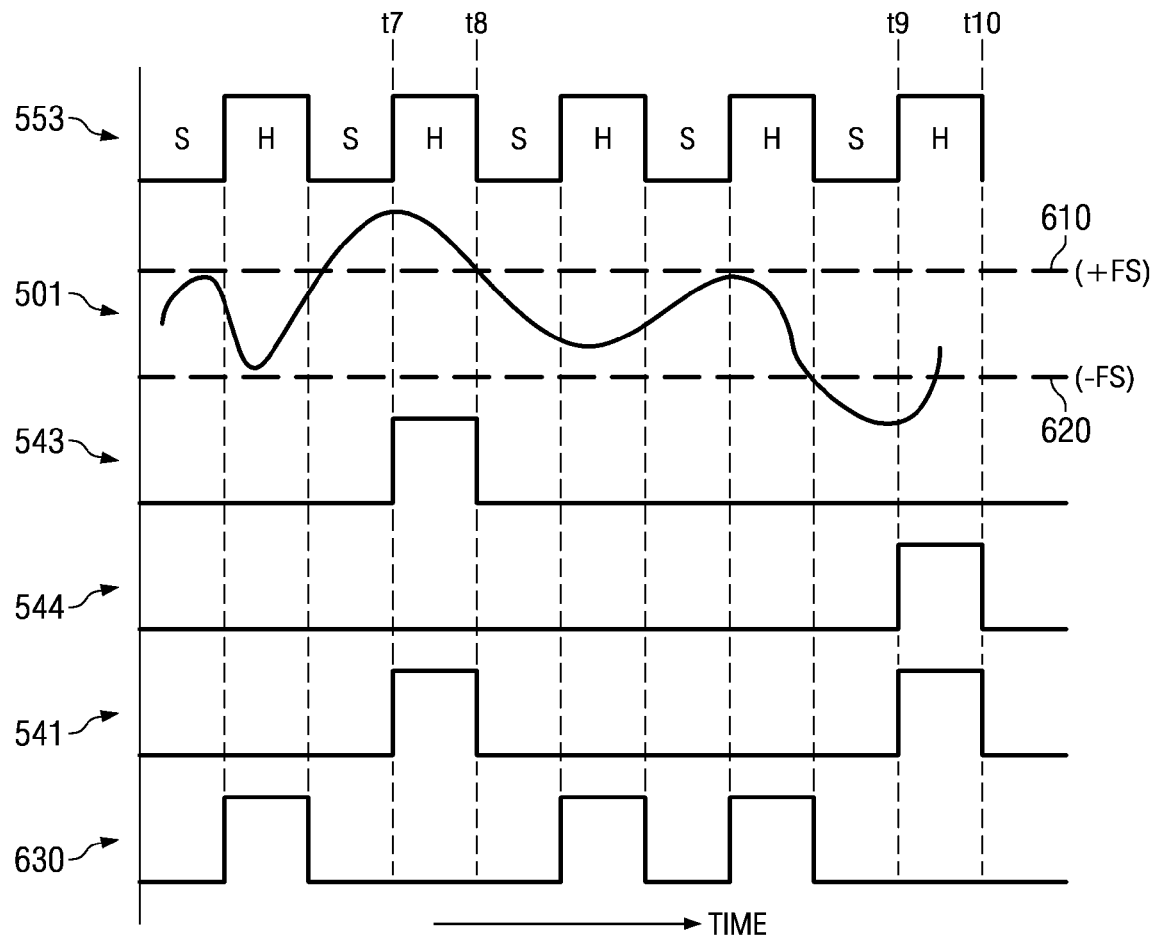
FIG. 6A is a timing diagram depicting the relationship among some signals in an ADC in an embodiment of the present invention.

The operation of ADC 500 described above is illustrated with respect to an example scenario in FIG. 6A. In FIG. 6A, input signal 501 is shown as exceeding the upper full-scale value 610 during time interval t7-t8, and lower full-scale value 620 during time interval t9-t10.

Since at start of hold phase at time instance t7, input 501 is greater than the upper full-scale value 610, overload sense block 540 activates (e.g., to logic 1) signal 543 during the period of the corresponding hold phase (interval t7-t8). Similarly, since at start of hold phase at time instance t9, input 501 is less than the lower full-scale value 620, overload sense block 540 activates (e.g., to logic 1) signal 544 during the period of the corresponding hold phase (interval t9-t10).

Overload sense block activates freeze signal 541 if signal 543 or 544 is active. Thus, signal 541 is shown active (logic 1) during intervals t7-t8, as well as t9-t10. Waveform 630 shows the corresponding hold clock signal to stage 520-1. It may be observed from the Figure that hold phases corresponding to the input overload conditions are inhibited. In other words, during such overload conditions, the amplifier is operated to avoid the saturation mode, and digital code 539 is instead provided equal to either +FS (610 in FIG. 6A) or −FS (620 in FIG. 6A), based on signals 543 and 544. The logic and circuitry within digital error correction block 530 to generate output 539 during overload conditions may be implemented in a known way.

Figure 6B:
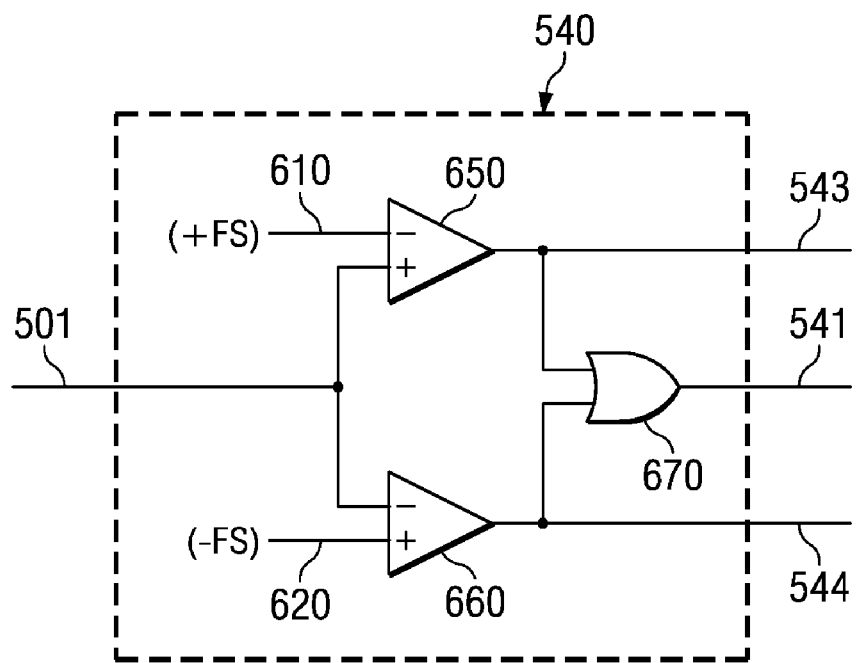
FIG. 6B is a diagram illustrating the manner in which an overload sense block is implemented in an embodiment of the present invention.

FIG. 6B is a logic diagram illustrating the implementation details of overload sense block 540 in an embodiment of the present invention. Comparator 650 receives input 501 and voltage 610 representing (equal to) the upper full-scale level of ADC 500. Comparator 660 receives input 501 and a voltage 620 representing (equal to) the lower full-scale level of ADC 500. Output 543 of comparator 650 is logic 1 when input 501 is greater than voltage 610, and logic 0 otherwise. Output 544 of comparator 660 is logic 1 when input 501 is less than voltage 610, and logic 0 otherwise. OR gate (670) provides the logical-OR of the values on paths 543 and 544. In an embodiment of the present invention, the logic of FIG. 6B is contained within the flash ADC of stage 520-1.

Figure 7:
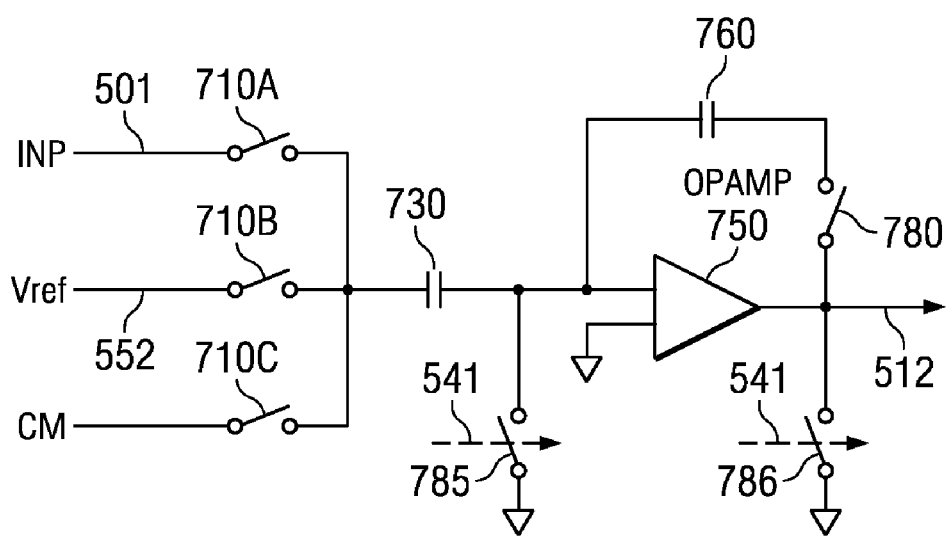
FIG. 7 is a circuit diagram of a portion of a stage of a pipeline ADC in an embodiment of the present invention.

As noted above, an active level of freeze signal 541 "disables" the amplifier portion (OPAMP 750) in stage 520-1, as illustrated with respect to FIG. 7. The circuit of FIG. 7 corresponds to the DAC, subtractor and amplifier combination of stage 520-1. Switches 710A-710C, switch 785, sampling capacitor 730, operational amplifier (OPAMP) 750, feedback capacitor 760, and feedback switch 780 respectively correspond to switches 310A-310C, switch 385, sampling capacitor 330, operational amplifier (OPAMP) 350, feedback capacitor 360, and feedback switch 380 of the circuit of FIG. 3, and operate in a manner similar to that described above with respect to FIG. 3.

In an embodiment of the present invention, freeze signal 541 operates to close switches 785 and 786 during the hold phases in which input signal 501 exceeds the full-scale range, i.e., during intervals t7-t8 and t9-t10 of FIG. 6A. The input and output of OPAMP 750 are therefore forced to zero volts during these intervals. The inputs and outputs of OPAMP 750 might be differential, and each of the input and output pairs might be shorted to a suitable common mode voltage. It may be noted that switch 785 is usually closed during a sample phase.

Since the input to OPAMP 750 is zero volts due to the shorting by switch 785 during hold phases corresponding to input overload conditions, OPAMP 750 is prevented from going into saturation. Signals 543/544 provided at corresponding overload intervals to digital error correction block 530 cause it to provide output digital codes corresponding to the upper limit or lower limit of the full-scale range depending on whether the input represents a positive overload or negative overload.

It may be understood that the above description is provided with respect to a pipeline ADC merely by way of illustration, and various aspects of the present invention apply in other types of ADCs as well. In general, according to several aspects of the present invention, an input signal (or its sampled value) is measured, and a determination is made whether the sample is outside the bounds of full scale range of an ADC. If input overload is detected, all subsequent analog processing of that particular input sample is frozen.

Thus, all amplifiers in the ADC are shielded from the input signal during the overload condition, and the information of overload input is conveyed to an output block that provides the final output code. This eliminates the saturation phenomena of the amplifiers that would normally happen in the presence of input overload.

ADSs thus implemented may be used in place of ADCs 124A-N of FIG. 1, thereby avoiding the problems described above. It should be appreciated that the ADCs can be used in various other devices/systems, which generate digital samples corresponding to the strength of analog input signals.

It should be further appreciated that while the embodiments above have been described as using comparators to sense input overload conditions, other techniques with corresponding modifications to the respective circuits will also be apparent to one skilled in the relevant arts. Although shown as processing single-ended signals, embodiments of the present invention can be implemented to process differential signals as well. Furthermore, though various terminals in circuits described above are shown with direct connections to various other terminals, it should be appreciated that additional components (as suited for the specific environment) may also be present in the path, and accordingly the connections may be viewed as being electrically coupled to the same connected terminals.

In addition, the circuit topologies of FIGS. 5, 6B and 7 are merely representative. Various modifications, as suited for the specific environment, without departing from the scope and spirit of several aspects of the present invention, will be apparent to one skilled in the relevant arts by reading the disclosure provided herein.

While various embodiments of the present invention have been described above, it should be understood that they have been presented by way of example only, and not limitation. Thus, the breadth and scope of the present invention should not be limited by any of the above-described embodiments, but should be defined only in accordance with the following claims and their equivalents.

What is claimed is:

1. An apparatus comprising:
   an analog-to-digital converter (ADC) that receives an analog input signal and that outputs a digital signal; and
   an overload sense circuit that receives the analog input signal and that is coupled to the ADC, wherein the overload sense circuit inhibits the ADC from sampling the analog input signal for sampling instants where the analog input signal is greater than a first threshold voltage, and wherein the overload sense circuit inhibits the ADC from sampling the analog input signal for sampling instants where the analog input signal is less than a second threshold voltage.

2. The apparatus of claim 1, wherein the overload sense circuit further comprises:
   a first comparator that receives the first threshold voltage and that receives the analog input signal, wherein the first comparator indicates when the analog input signal is greater than the first threshold voltage;
   a second comparator that receives the second threshold voltage and that receives the analog input signal, wherein the second comparator indicates when the analog input signal is less than the second threshold voltage; and
   an OR gate that is coupled to the first and second comparators.

3. The apparatus of claim 1, wherein the overload sense circuit further comprises:
   a first comparator that receives the first threshold voltage and that receives the analog input signal, wherein the first comparator indicates when the analog input signal is greater than the first threshold voltage;
   a second comparator that receives the second threshold voltage and that receives the analog input signal, wherein the second comparator indicates when the analog input signal is less than the second threshold voltage; and
   an OR gate that is coupled to the first and second comparators.

4. The apparatus of claim 3, wherein the ADC further comprises:
   a pipeline of ADC stages, wherein the first ADC stage of the pipeline receives the analog input signal, and wherein the first ADC stage of the pipeline is coupled to the OR gate so that the first ADC stage of the pipeline is inhibited from sampling the analog input signal when the analog input signal is greater than the first threshold voltage or less than the second threshold voltage; and
   a digital error correction circuit that is coupled to each ADC stage of the pipeline, the first comparator, and the second comparator.

5. The apparatus of claim 3, wherein the ADC further comprises:
   a pipeline of ADC stages, wherein the first ADC stage of the pipeline receives the analog input signal, and wherein the first ADC stage of the pipeline is coupled to the OR gate so that the first ADC stage of the pipeline is inhibited from sampling the analog input signal when the analog input signal is greater than the first threshold voltage or less than the second threshold voltage; and
   a digital error correction circuit that is coupled to each ADC stage of the pipeline, the first comparator, and the second comparator.

6. The apparatus of claim 5, wherein each ADC stage further comprises:
   a flash ADC having an input and an output;
   a digital-to-analog converter (DAC) that is coupled to the output of the flash ADC;
   a subtractor that is coupled to the DAC and the input of the flash ADC; and
   a residue amplifier that is coupled to the subtractor.

7. The apparatus of claim 6, wherein the input circuit further comprises:
   a low noise amplifier that is coupled to the transducer array;
   a voltage controlled amplifier that is coupled to the low noise amplifier; and
   a filter that is coupled between the voltage controlled amplifier and the ADC.

8. The apparatus of claim 5, wherein each ADC stage further comprises:
   a flash ADC having an input and an output;
   a digital-to-analog converter (DAC) that is coupled to the output of the flash ADC;
   a subtractor that is coupled to the DAC and the input of the flash ADC; and
   a residue amplifier that is coupled to the subtractor.

9. An apparatus comprising:
   a processor;
   a transducer array;
   a beam forming circuit that is coupled to the processor;
   a transmit circuit that is coupled between the beam forming circuit and the transducer array; and
   a receive circuit having a plurality of processing pipelines, wherein each pipeline includes:
      an input circuit that is coupled to the transducer array;
      an ADC that is coupled to the input circuit and the beam forming circuit, wherein the ADC receives an analog input signal from the input circuit; and
      an overload sense circuit that is coupled to the ADC and the input circuit, wherein the overload sense circuit inhibits the ADC from sampling the analog input signal for sampling instants where the analog input signal is greater than a first threshold voltage, and wherein the overload sense circuit inhibits the ADC from sampling the analog input signal for sampling instants where the analog input signal is less than a second threshold voltage.

* * * * *